(12) United States Patent
Goussin et al.

(10) Patent No.: US 7,801,498 B2
(45) Date of Patent: Sep. 21, 2010

(54) TRANSMISSION OF ANALOG SIGNALS IN A SYSTEM-ON-CHIP

(75) Inventors: Franck Goussin, Saint Egreve (FR); Claire Tassin, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 299 days.

(21) Appl. No.: 11/857,164

(22) Filed: Sep. 18, 2007

(65) Prior Publication Data
US 2008/0285676 A1   Nov. 20, 2008

(30) Foreign Application Priority Data
Sep. 18, 2006   (FR)   .................................. 06 08154

(51) Int. Cl.
    H04B 1/04   (2006.01)
(52) U.S. Cl. .................................... 455/127.1; 455/118
(58) Field of Classification Search .................... 455/91, 455/114.1, 115.1, 118, 119, 126, 127.1, 127.2, 455/127.3, 127.5; 330/86, 254, 255, 278, 330/282; 375/295, 296, 297
See application file for complete search history.

(56) References Cited

U.S. PATENT DOCUMENTS 7,570,930 B2*   8/2009   Eisenhut et al. .......... 455/127.3

2002/0118065 A1*   8/2002   Miyamoto ................... 330/254
2005/0111573 A1    5/2005   Shakeshaft et al. .......... 375/295

FOREIGN PATENT DOCUMENTS

WO   02/37667 A1   5/2002

OTHER PUBLICATIONS

Gilbert, B., "A New Technique for Analog Multiplication," IEEE Journal of Solid-State Circuits, vol. SC-10, No. 6, Dec. 1975, pp. 437-447.

* cited by examiner

Primary Examiner—Thanh C Le
(74) Attorney, Agent, or Firm—Lisa K. Jorgenson; Robert Iannucci; Seed IP Law Group PLLC

(57) ABSTRACT

A circuit of a system-on-chip for the transmission of an analog signal at a given transmission frequency modulated by a digital input signal coded in a number m of bits, includes $2^m-1$ unit cells each having a first block adapted to receive an activation voltage through an associated switch, and a second block with a first input path coupled to an output path of the first block, a second input path receiving a local oscillator signal, and an output path coupled to the output path of the circuit, with the switches each controlled as a function of the value of a bit of the digital input signal, the bit of index j of the digital input signal where j is between 0 and m−1, controlling the switches respectively associated with $2^j$ unit cells.

15 Claims, 3 Drawing Sheets

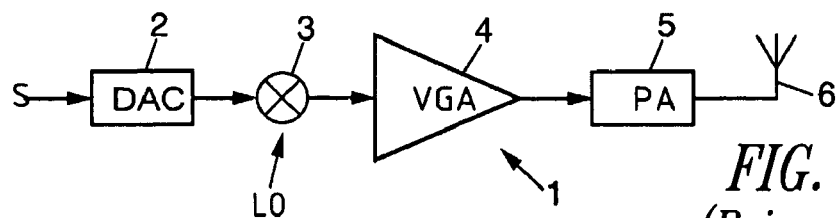
FIG. 1
*(Prior Art)*
FIG. 3a
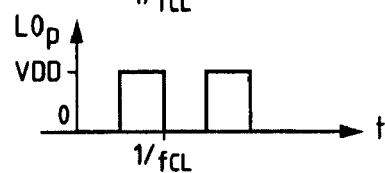
FIG. 3b
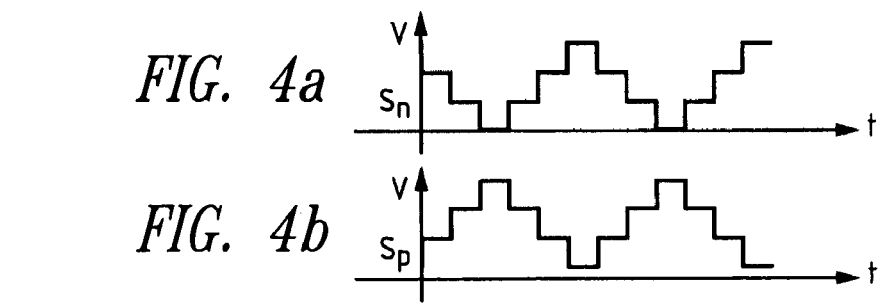
FIG. 4a
FIG. 4b
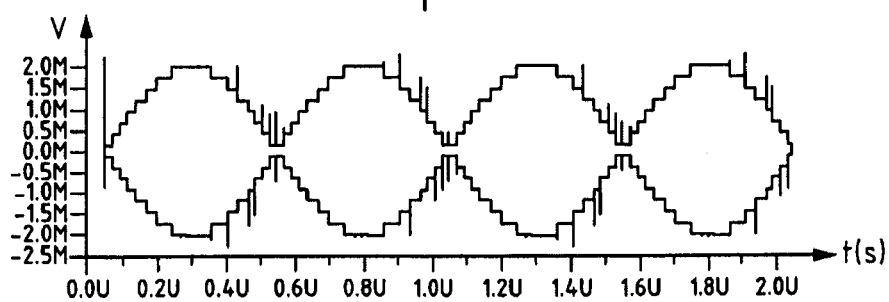
FIG. 5a
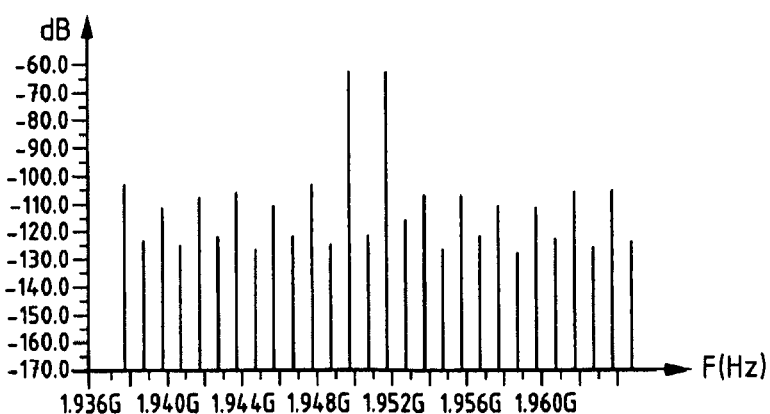
FIG. 5b

TRANSMISSION OF ANALOG SIGNALS IN A SYSTEM-ON-CHIP

TECHNICAL FIELD

The present disclosure generally relates to the transmission of an analog signal, such as a radiofrequency (RF) signal, in integrated circuit systems or systems-on-chip (SoC).

BACKGROUND INFORMATION

As shown in FIG. 1, a system 1 comprises at least one digital-to-analog converter 2 receiving a baseband digital signal S as an input, an RF (Radio Frequency) mixer 3 which converts the signal to a radio frequency L0, a variable gain amplifier 4, a power amplifier 5, and a transmitting antenna 6.

There is a desire to further increase the integration of the integrated circuits comprising such systems, in order to reduce their manufacturing costs.

For example, U.S. Patent Application Publication No. 2005/0111573 proposes a technique for combining the digital-to-analog conversion and the mixer functions within the same circuit. This circuit comprises a plurality of parallel Gilbert cells. Each cell comprises three serial stages: the first stage comprises a current source, the second stage provides signals from a local oscillator for modulating the currents of the third stage, and the third stage provides currents as a function of the value of a baseband signal.

BRIEF SUMMARY

An embodiment provides a solution which allows combining the digital-to-analog conversion and mixer functions, and allows combining the variable gain amplification function as well.

An embodiment provides a circuit of a system-on-chip for transmitting an analog signal at a given transmission frequency, modulated by a digital input signal coded in a number m of bits where m is a given integer number.

A circuit according to one embodiment comprises at least one output path delivering the analog signal to be transmitted, a power supply delivering an activation voltage, and a number $2^m-1$ of unit cells. Each of the number $2^m-1$ of unit cells includes a first block with at least one input path coupled to a power supply for receiving the activation voltage through an associated switching unit, and at least one output path, and a second block with at least a first input path coupled to the output path of the first block, at least a second input path receiving a local oscillator signal, and at least one output path coupled to the output path of the circuit, wherein the switching elements are each controlled as a function of the value of a bit of a digital input signal, the bit of index j of the digital input signal where j is between 0 and m−1, controlling the switching elements respectively associated with the basic unit cells of a group of $2^j$ unit cells.

One embodiment allows combining the digital-to-analog conversion and mixer functions within the same integrated circuit.

In addition, each cell presents two stages, unlike the three stages of the prior art as described in U.S. Patent Application Publication No. 2005/0111573, which limits the reduction of the maximum voltage at the circuit output load terminals. The two-stage characteristic also allows decreasing of the overall dimensions and the cost of the circuit.

Moreover, one embodiment of the invention allows reducing energy consumption (lower number of cells activated for each value assumed by the baseband signal) unlike the technique described in U.S. Patent Application Publication No. 2005/0111573, wherein the cells all comprise a current source, and therefore are always biased which increases the static current consumption.

A circuit, according to one embodiment, also allows combining the variable gain amplification function, in addition to the two digital-to-analog conversion and mixer functions. To reduce or increase the power by a factor k, it is sufficient to reduce or increase by said factor k the intensity of the DC current source $I_{DC}$. The gain is thus easily adaptable through the use of the same integrated circuit.

In one embodiment of the invention, the digital input signal is a baseband signal, with the frequency of the local oscillator signal being equal to a radiofrequency (e.g., the transmission frequency or an intermediate frequency).

In one embodiment of the invention, the power supply is arranged to regulate the activation voltage in response to a command to regulate the power of the analog signal to be sent. The regulation of this activation voltage has a direct effect on the power of the signal delivered by the circuit.

In one embodiment of the invention, the digital input signal is a differential digital signal defined by the difference between a first digital component and a second digital component.

According to one embodiment, the first stage comprises a first and a second transistor arranged such that the gate of the first transistor is coupled to a control terminal of a first switching element controlled by the first digital signal component, with another terminal of said first switching element being coupled to the power supply in order to receive the activation voltage, the gate of the second transistor is coupled to a control terminal of a second switching element controlled by the second digital signal component, with another terminal of said second switching element being coupled to the power supply in order to receive the activation voltage, the respective sources of the first and second transistors are coupled to a reference potential, and the drain of the first and second transistors being respectively coupled to a first and a second output path from the first block.

According to one embodiment, the second stage comprises a first pair of transistors, with a third and a fourth transistor, and a second pair of transistors, with a fifth and a sixth transistor, with said third, fourth, fifth, and sixth transistors being arranged such that the sources of the third and fourth transistors are coupled to the drain of the first transistor, the sources of the fifth and sixth transistors are coupled to the drain of the second transistor, the gate of the fourth transistor is coupled to the gate of the fifth transistor, the drains of the third and fifth transistors are respectively coupled to a first output path from the second block, and the drains of the fourth and sixth transistors are respectively coupled to a second output path from the second block.

Another embodiment of the invention provides a system-on-chip comprising an integrated circuit according to one embodiment of the invention.

BRIEF DESCRIPTION OF THE SEVERAL VIEWS OF THE DRAWINGS

Other features of one or more embodiments of the invention will become more clear upon reading the description which follows. This is purely illustrative and is to be read while referring to the attached drawings, wherein:

FIG. 1 is a system previously described.

FIG. 3a is an example graph representing the negative part LOn of a differential oscillator signal LO at a frequency $f_{CL}$, as a function of time, according to one illustrated embodiment.

FIG. 3b is an example graph representing the positive part LOp of an oscillator signal LO at the frequency $f_{CL}$, as a function of time, according to one illustrated embodiment.

FIG. 4a is an example graph representing the values assumed over time by the negative part Sn of a differential digital signal S, according to one illustrated embodiment.

FIG. 4b is an example graph representing the values assumed over time by the positive part Sp of a differential digital signal S, according to one illustrated embodiment.

FIG. 5a is an example graph representing the variations over time of a digital signal output from an integrated circuit in one embodiment of the invention.

FIG. 5b is an example graph representing the components of the Fourier transformation of the signal of FIG. 5a, according to one embodiment.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 2:
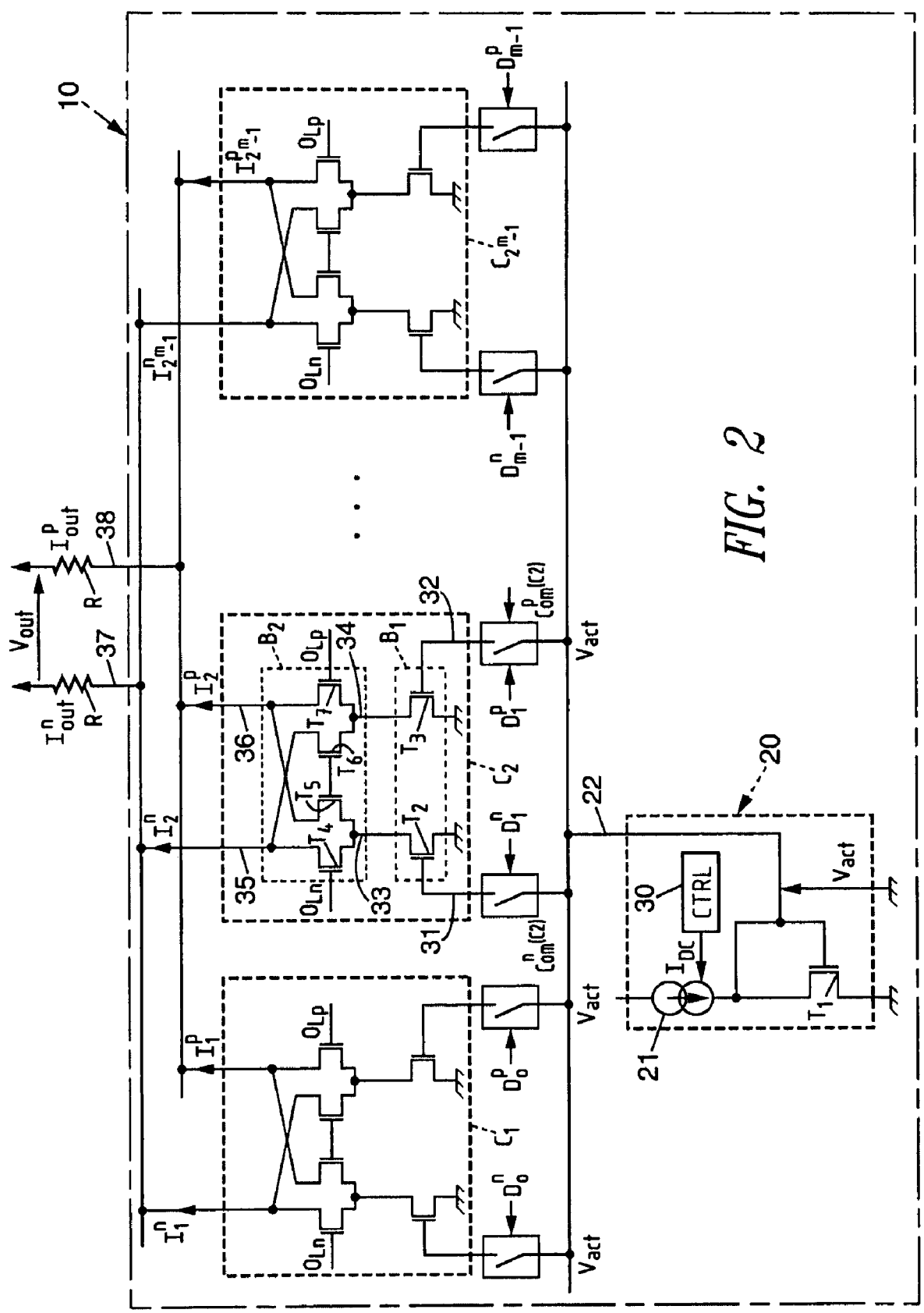
FIG. 2 is a schematic illustration of an integrated circuit, according to one embodiment of the invention.

A system-on-chip may, for example, be adapted to receive a digital signal as input and to output an analog signal converted to the transmission frequency FS of a carrier wave (The transmission frequency FS is typically within the radiofrequency domain, for example FS=1.95 GHz), intended for example to be transmitted from a base station by the use of a transmitting antenna. In one embodiment, the system comprises an integrated circuit 10 such as represented in FIG. 2, followed by a power amplifier (not illustrated). The circuit 10 is, for example, created using CMOS technology, but can also be created using BiCMOS, bipolar, or other technology.

The integrated circuit 10 comprises a power supply 20 providing the activation voltage Vact, which comprises for example a source of direct current 21 delivering a current of intensity $I_{DC}$.

Conversion of this current of intensity $I_{DC}$ into DC voltage, the activation voltage Vact, is achieved using a transistor T1 mounted as an $I_{DC}$ current mirror transistor. The transconductance of the transistor T1 is G1 ($I_{DC}$=G1×Vact) and it operates in its saturated region. The drain of the transistor T1 is coupled to the output of the current source 21 and to the gate of the transistor T1. The activation voltage Vact is delivered on a conductive path 22, coupled to the gate of the transistor T1. The source of the transistor T1 is coupled to the ground.

The circuit 10 additionally comprises a control unit 30 adapted to decrease or increase the value of the current intensity $I_C$ as a function of the commands received from the base station requesting a decrease or increase in the power of the output signal from the circuit 10. For example, in one embodiment, the current source 21 comprises a plurality of basic current sources, each selectable by the use of a respective switch controlled by the control unit 30.

The integrated circuit 10 is adapted to receive a digital signal S, such as a baseband signal, as input. In one variant, this can be a digital signal modulated to an intermediate frequency. In the embodiment in question, the digital signal S is provided in a differential form, using two digital signals Sn and Sp in baseband: S=Sp−Sn. The sampling frequency of the digital signal is designated by fs.

The integrated circuit 10 is adapted to process the signal Sn which can assume $2^m$ different values (m is an integer number greater than or equal to 1), each coded in m bits, respectively $D_0^n$ to $D_{m-1}^n$. Similarly, the integrated circuit 10 is adapted to process the signal Sp which can assume $2^m$ different values, each coded in m bits, respectively $D_0^p$ to $D_{m-1}^p$.

In the embodiment in FIG. 2, the integrated circuit 10 comprises $2^m-1$ unit cells $C_1, C_2, \ldots, C_{2^m-1}$ arranged in parallel.

Each cell $C_1, C_2, \ldots, C_{2^m-1}$ can, for example, be a Gilbert cell. The document "A New Technique for Analog Multiplication" by Barrie Gilbert, IEEE Journal of Solid-State Circuits, vol. SC-10, no. 9, December 1975, presents the Gilbert cell. Each cell is preferably similar to the cell $C_2$, which is the cell described in detail below with reference to FIG. 2.

The cell $C_2$ comprises at least two successive stages, respectively including blocks B1 and B2.

The block B1 comprises two input conductive paths 31 and 32. One end of the conductive path 31 is coupled to the gate of a transistor T2 and one end of the conductive path 32 is coupled to the gate of a transistor T3.

The sources of the transistors T2 and T3 are both connected to the ground. The drain of the transistor T2 is coupled to a first input conductive path 33 of the block B2, and the drain of the transistor T3 is coupled to a second input conductive path 34 of the block B2.

The block B2 additionally comprises a first pair of transistors T4 and T5, and a second pair of transistors T6 and T7.

The common sources of transistors T4 and T5 are coupled to the input conductive path 33. The drain of the transistor T4 is coupled to a first output conductive path 35 from the block B2 and the cell $C_2$.

The common sources of the transistors T6 and T7 are coupled to the input conductive path 34. The drain of the transistor T7 is coupled to a second output conductive path 36 from the block B2 and the cell $C_2$.

The gates of the transistors T5 and T6 are coupled to each other.

The drain of the transistor T5 is coupled to the output conductive path 36, while the drain of the transistor T6 is coupled to the output conductive path 35.

The output path 35 of the cell $C_2$ is coupled to an output conductive path 37 of the circuit 40. The output path 36 of the cell $C_2$ is coupled to an output conductive path 38 of the circuit 40.

A local oscillator signal is provided to the integrated circuit 10, here in the form of a differential signal corresponding to the difference between two signals LOp and LOn. This local oscillator signal is the RF carrier intended to be modulated by the digital signal S.

In the embodiment in question, the signal LOn, represented in FIG. 3a, is a square signal, having the values 0 or VDD. The frequency of the signal LOn is labeled $f_{CL}$. The signal LOp, represented in FIG. 3b, is also a square signal, having the values of 0 or VDD in phase opposition to LOn. The frequency of the signal LOp is the frequency $f_{CL}$.

The signal LOn is applied to the gate of the transistor T4, while the signal LOp is applied to the gate of the transistor T7.

Two switches $Com^n$ ($C_2$) and $Com^p$ ($C_2$) are placed upstream from the block B1 of the cell $C_2$.

A terminal of $Com^n$ ($C_2$) is coupled to the input conductive path 31 of the cell $C_2$. The other terminal of $Com^n$ ($C_2$) is coupled to the path 22 delivering the activation voltage Vact.

A terminal of $Com^p$ ($C_2$) is coupled to the input conductive channel 32 of the cell $C_2$. The other terminal of $Com^p$ ($C_2$) is coupled to the path 22 delivering the activation voltage Vact.

The transistors T1, T2, and T3 present substantially the same technical characteristics (channel width, threshold voltage, transconductance, etc.). The voltage Vact provided is such that it allows transistors T2 and T3 to operate in a saturated region when it is applied to the gate of these transistors.

The transistors T4, T5, T6 and T7 present substantially the same technical characteristics (channel width, threshold voltage, transconductance, etc.).

Similarly, in each cell $C_1, C_2, \ldots, C_{2^m-1}$, the output path corresponding to the output path 35 of the cell $C_2$ is also coupled to the output conductive path 37 of the printed circuit 10, and the output path corresponding to the output path 36 of the cell $C_2$ is also coupled to the output conductive path 38 of the circuit 10.

Upstream from each cell $C_1, C_2, \ldots, C_{2^m-1}$ are also placed two respective switches associated with the cell. The switches, placed upstream from cell $C_i$ where i=1 to $2^m-1$, are referred to as $Com^n$ ($C_i$) and $Com^p$ ($C_i$).

A terminal of switch $Com^n$ ($C_i$), i=1 to $2^m-1$, is coupled to the input conductive path of the cell $C_i$ corresponding to the conductive path 31 of the cell $C_2$. The other terminal of switch $Com^n$ ($C_i$), for i=1 to $2^m-1$, is coupled to the path 22 delivering the activation voltage Vact.

A terminal of switch $Com^p$ ($C_i$) is coupled to the input conductive path of the cell $C_i$ corresponding to the input conductive path 32 of cell $C_2$. The other terminal of switch $Com^p$ ($C_i$) is coupled to the path 22 delivering the activation voltage Vact.

Each switch, $Com^n$ ($C_i$) and $Com^p$ ($C_i$) for i=1 to $2^m-1$, is controlled by a respective control signal. In the case under discussion here, when the value of this control signal is equal to 1 the switch is closed, and when this value is equal to 0 the switch is open.

In one embodiment of the invention, the value of the control signals for switches $Com^n$ ($C_i$) and $Com^p$ ($C_i$), for i=1 to $2^m-1$, is a function of the binary value of bits $D_0^n$ to $D_{m-1}^n$ and $D_0^p$ to $D_{m-1}^p$, respectively.

In the embodiment of the invention considered in FIG. 2, the value of the control signal for switch $Com^n$ ($C_1$) at the input to cell $C_1$ is equal to the binary value of bit $D_0^n$ and the value of the control signal for switch $Com^p$ ($C_1$) at the input to cell $C_1$ is equal to the binary value of bit $D_0^p$.

The respective values of the control signals for switches $Com^n$ ($C_2$) and $Com^n$ ($C_3$) at the input to cells $C_2$ and $C_3$ are equal to the value of bit $D_1^n$, and the respective values of the control signals for switches $Com^p$ ($C_2$) and $Com^p$ ($C_3$) at the input to cells $C_2$ and $C_3$ are equal to the value of bit $D_1^p$.

The respective values of the control signals for switches $Com^n$ ($C_4$) to $Com^n$ ($C_7$) at the input to cells $C_4$ to $C_7$ are equal to the value of bit $D_2^n$, and the respective values of the control signals for switches $Com^p$ ($C_4$) to $Com^p$ ($C_7$) at the input to cells $C_4$ to $C_7$ are equal to the value of bit $D_2^p$.

More generally, the value of each bit $D_j^n$ and the value of each bit $D_j^p$, where j=0 to m-1, respectively control the two switches upstream of $2^j$ unit cells (which are the cells weighted by $D_j^n$ and $D_j^p$) of the cells $C_1, C_2, \ldots C_{2^m-1}$.

The control signal for a switch placed upstream from the first stage (corresponding to block B1 of unit cell $C_2$) of a unit cell is therefore equal to the value of an associated bit of the digital signal. The value assumed by the control signal is thus refreshed at a frequency fs, where the frequency fs is the sampling frequency of the digital signal to be converted.

With reference to cell $C_2$, a function of block B1 is to deliver on path 33 a direct current of intensity $I_{DC}$ when switch $Com^n$ ($C_2$) is closed, meaning when bit $D_1^n$ assumes the value of 1. Another function of block B1 is to deliver on path 34 a direct current of intensity $I_{DC}$ when switch $Com^p$ ($C_2$) is closed, meaning when bit $D_1^p$ assumes the value of 1.

When switch $Com^n$ ($C_2$) is open, meaning when bit $D_1^n$ assumes the value of 0, no current is delivered on path 33 by the block B1. Similarly, when switch $Com^p$ ($C_2$) is open, meaning when bit $D_1^p$ assumes the value of 0, no current is delivered on path 34 by the block B1.

When switches $Com^n$ ($C_2$) and $Com^p$ ($C_2$) are both open, no current is delivered on path 33 or path 34. The cell $C_2$ is therefore not activated.

When at least one of switch $Com^n$ ($C_2$) and switch $Com^p$ ($C_2$) is closed, current is delivered on at least one path of path 33 and path 34. The cell $C_2$ is then activated.

For a given value of the index j between 0 to m−1, the sum of the currents flowing through the path corresponding to the path 33 of the cell $C_2$ in the $2^j$ unit cells for which switch $Com^n$ ($C_j$) is controlled by bit $D_j^n$, is equal to $D_j^n \times 2^j \times I_{DC}$.

And the sum, for all cells $C_1, C_2, \ldots, C_{2^m-1}$, of the currents flowing through the path corresponding to the path 33 of the cell $C_2$, is equal to $I_{DC} \times (2^0.D_0^n + 2^1.D_1^n + 2^2.D_2^n + \ldots + 2^{m-1}.D_{m-1}^n)$.

Similar equalities are obtained for the sums of the currents flowing through the path 34.

The block B2 of cell C2 has the function of modulating the frequency $f_{CL}$ of the local oscillator signal by the currents which are delivered by the block B1 on path 33 and path 34.

When a current of intensity $I_{DC}$ is sent by block B1 over path 33 (switch $Com^n$ ($C_2$) closed), this current is sent in turn either to transistor T4 or to transistor T5 (the destination transistor changes at frequency $f_{CL}$, each time the high voltage VDD is reached by the signal LOn).

Similarly, when a current of intensity $I_{DC}$ is sent by block B1 over path 34 (switch $Com^p$ ($C_2$) closed), this current is sent in turn either to transistor T6 or to transistor T7.

The current flowing through path 35 is labeled as $I_2^n$ and the current flowing through path 36 is labeled as $I_2^p$, such that the following four cases are distinguishable:

Case a: $I_2^p - I_2^n = 0$, when the value of bit $D_1^n$ (controlling the switch $Com^n$ ($C_2$)) is equal to 0 and the value of bit $D_1^p$ (controlling the switch $Com^p$ ($C_2$)) is equal to 0, Case b: $I_2^p - I_2^n = I_{DC} \times LOp$, when the value of bit $D_1^n$ (controlling the switch $Com^n$ ($C_2$)) is equal to 0 and the value of bit $D_1^p$ (controlling the switch $Com^p$ ($C_2$)) is equal to 1, Case c: $I_2^p - I_2^n = I_{DC} \times LOn$, when the value of bit $D_1^n$ (controlling the switch $Com^n$ ($C_2$)) is equal to 1 and the value of bit $D_1^p$ (controlling the switch $Com^p$ ($C_2$)) is equal to 0, Case d: $I_2^p - I_2^n = I_{DC} \times (LOp - LOn)$, when the value of bit $D_1^n$ (controlling the switch $Com^n$ ($C_2$)) is equal to 1 and the value of bit $D_1^p$ (controlling the Switch$^p$ ($C_2$)) is equal to 1.

Cases a and case d are generally not encountered, as the signals Sn and Sp are such that the binary value of bit $D_i''$ differs from the binary value of bit $D_i^p$ for i=0 to m−1.

The total current $I_{out}''$ flowing through path 37 is equal to the sum of the currents delivered on this path 37 by the $2^m-1$ cells $C_1, C_2, \ldots, C_{2^m-1}$. It is equal to the sum, for these $2^m-1$ cells $C_1, C_2, \ldots, C_{2^m-1}$, of the currents delivered on the paths corresponding to path 33, converted to the frequency LOn.

And the total current $I_{out}^p$ flowing through path 38 is a current of frequency $f_{CL}$, equal to the sum of the currents delivered to path 38 by the $2^m-1$ cells $C_1, C_2, \ldots, C_{2^m-1}$. It is equal to the sum, for these $2^m-1$ cells $C_1, C_2, \ldots, C_{2^m-1}$, of the currents delivered on the paths corresponding to path 34, converted to the frequency LOp.

In the embodiment described with reference to the figures, a pair of dedicated switches is assigned to each unit cell. In another embodiment, a single pair of switches can be used for the group of $2^j$ cells whose activation depends on the value of a same bit $D_j^p$ and a same bit $D_j''$, meaning for the group of $2^j$ cells weighted by the bit $D_j^p$ and the bit $D_j''$.

Figure 6:
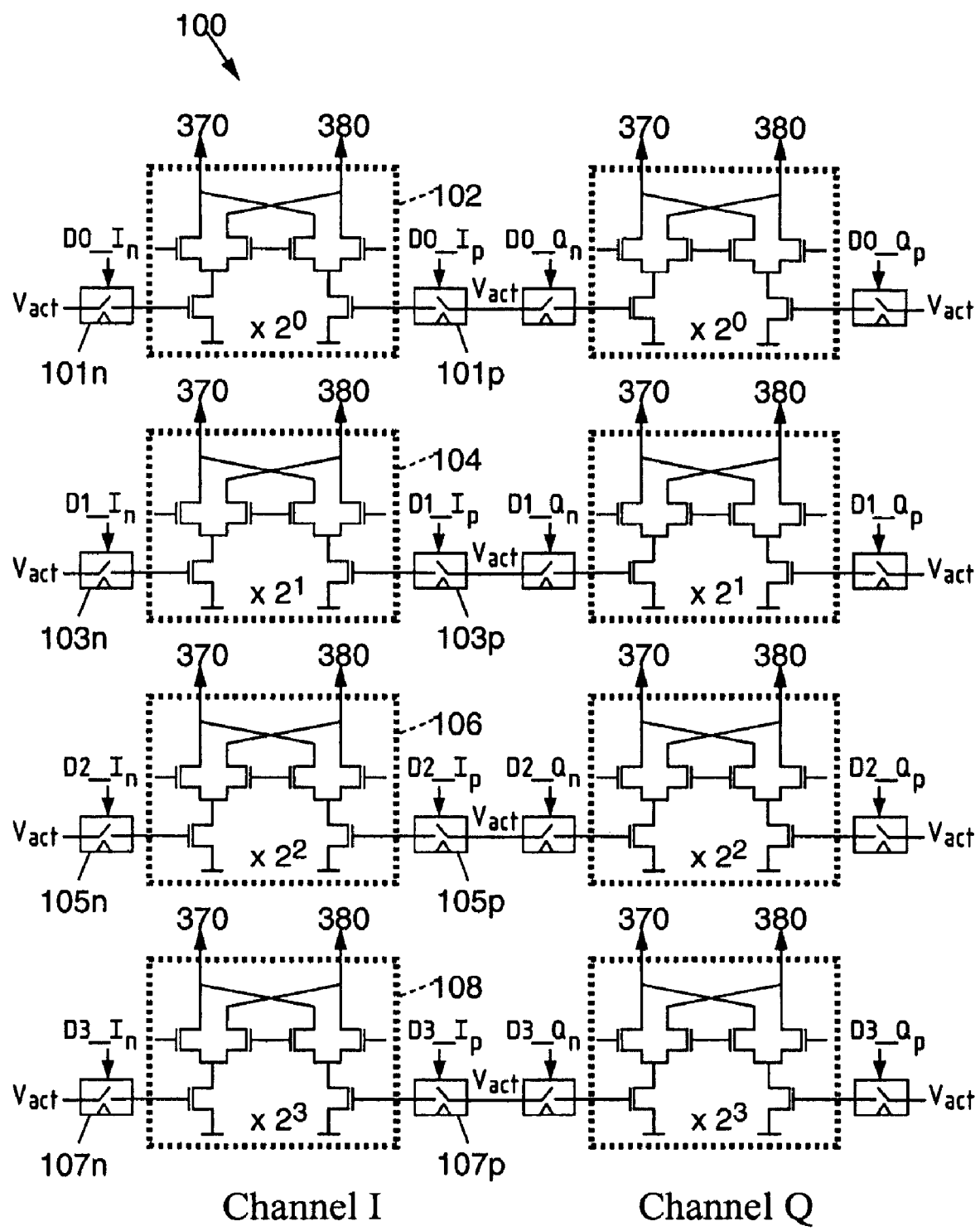
FIG. 6 is a schematic illustration of an integrated circuit according to one embodiment of the invention.

For example, FIG. 6 shows an integrated circuit 100 adapted to process two differential digital signals: an in-phase differential digital signal (channel I) and a quadrature differential digital signal (channel Q). On each of these two channels I and Q, the differential digital signal is processed as described above with reference to FIG. 2, with m=4.

One of the differential digital signals of channel I is coded in the four bits D0_In, D1_In, D2_In, D3_In, the other in the four bits D0_Ip, D1_Ip, D2_Ip, D3_Ip.

One of the differential digital signals of channel Q is coded in the four bits D0_Qn, D1_Qn, D2_Qn, D3_Qn, the other in the four bits D0_Qp, D1_Qp, D2_Qp, D3_Qp.

For channel I, the bit D0_In controls a switch 101*n* activating a group 102 of $2^0$ cells, the bit D1_In controls a switch 103*n* activating a group 104 of $2^1$ cells, the bit D2_In controls a switch 105*n* activating or not activating a group 106 of $2^2$ cellules, and the bit D3_In controls a switch 107*n* activating or not activating a group 108 of $2^3$ cells.

The bit D0_Ip controls a switch 101*p* activating the group 102 of $2^0$ cells, the bit D1_Ip controls a switch 103*p* activating the group 104 of $2^1$ cells, the bit D2_Ip controls a switch 105*p* activating the group 106 of $2^2$ cellules, and the bit D3_Ip controls a switch 107*p* activating the group 108 of $2^3$ cells.

The output paths for each cell in channel I, which correspond to path 35 of the cell C2 described above, are connected to the global path 370 (corresponding to path 37 in FIG. 2). The output paths for each cell, which correspond to path 36 of the cell C2 described above, are connected to the global path 380 (corresponding to path 38 in FIG. 2).

The operation is similar for channel Q. The output path for signals of negative polarity, for the cells in channel I, is coupled to the path for the cells in channel Q, labeled 370 in FIG. 6. The output path for signals of positive polarity, for the cells in channel I, is coupled to the path for the cells in channel Q, labeled 380 in FIG. 6.

An integrated circuit as described above thus combines the digital-to-analog converter and frequency mixer functions. The carrier at frequency $f_{CL}$ is modulated by the digital signal. More particularly, digital modulation of the carrier is performed in each unit cell.

When the integrated circuit is functioning under normal operating conditions, the base station or the mobile equipment comprising the integrated circuit may generate a command requesting an increase or decrease in the power of the output from the integrated circuit 10.

Modifying the power of the output from the differential integrated circuit 10 by a factor k is the same as modifying by a factor $\sqrt{k}$ the intensity of the differential current ($I_{out}^p - I_{out}''$) at the output of the integrated circuit. The modification in the power gain at the output of the integrated circuit 10 is therefore obtained by modifying by a factor $\sqrt{k}$ the value of the intensity $I_{DC}$ of the current delivered by the current source 21 of the power supply 20. The response of the integrated circuit 10 to the command generated by the base station or the mobile equipment is therefore easily obtained by modifying the intensity $I_{DC}$, using the control unit 30 for example.

Thus, in addition to the digital-to-analog converter and frequency mixer functions, the integrated circuit provides a variable gain amplifier (VGA) function which allows adaptive control of the gain.

Each cell only has two stages, not the three stages as in U.S. Patent Application Publication No. 2005/0111573, discussed in the introduction. This characteristic limits the reduction of the maximum voltage at the circuit output load terminals (the higher the number of stages, the more this max voltage decreases). This characteristic also allows decreasing the overall dimensions and the cost of the circuit.

In addition, power is supplied in one embodiment of the invention only to the cells whose switches receive signals corresponding to bits with the value of 1, not all cells, which reduces energy consumption in comparison to the prior art technique disclosed in the document cited above.

A circuit of one embodiment of the invention also reduces to negligible levels the interference, called LO leakage, which conventionally appears at frequency $f_{CL}$ of the local oscillator in the output of a radiofrequency channel of the prior art.

The digital-to-analog conversion range of a circuit of the invention is always adapted to the level of the digital input signal S. This allows obtaining a full scale conversion. There is none of the lower quantification limit problem encountered in the prior art.

The adaptive gain thus realized by the integrated circuit is digital (the adaptation is done prior to the mixing block B2), while it is analog in the prior art circuits. In fact, in the prior art circuits, the LO leakage is aggravated if the gain is adapted digitally, which is why it is generally preferred to perform the adaptation analogically at the expense of greater surface area and energy consumption.

Let us illustrate with a differential digital signal S (S=Sp−Sn) describing a 1 MHz sine wave oversampled at $f_S$=200 MHz. In FIG. 4a, the digital signal Sn is represented as a function of time, while FIG. 3b shows signal Sp as a function of time.

FIG. 5a shows the differential signal Vout obtained at the output of an integrated circuit as described above, with m=4, $f_{CL}$=1.95 GHz, and Vout=R ($I_{out}^p - I_{out}''$) where R is a load resistor serial to the output of the integrated circuit 10, in paths 37 and 39 (R=100 ohms for example).

FIG. 5b shows the discrete Fourier transform of the signal Vout (output from an integrated circuit on channel I or channel Q), which has two primary lines at frequencies ($f_{CL}-f_S$) and +($f_{CL}+f_S$). The LO leakage (corresponding to a line at frequency $f_{CL}$) is negligible here: the power of the component at frequency $f_{CL}$ is less than 40 dBc, in compliance with the WCDMA specification for example. The addition of signals from channel I and channel Q will result in one single line at frequency ($f_{CL}-f_S$).

In the embodiments described above with reference to the figures, the invention was implemented in a circuit for processing differential digital input signals. However, the invention is completely transposable to the case of a circuit for processing single digital signals.

The various embodiments described above can be combined to provide further embodiments. All of the U.S. patents, U.S. patent application publications and U.S. patent applications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A circuit of a system-on-chip to transmit an analog signal at a given transmission frequency modulated by a digital input signal coded in a number m of bits, where m is a given integer number, the circuit comprising:
   at least one circuit output path to deliver the analog signal to be transmitted;
   a power supply to deliver an activation voltage; and
   a number $2^m-1$ of unit cells, each including:
      a first block including at least one input path coupled to the power supply to receive the activation voltage through a respective one of switching elements, and at least one output path, and
      a second block including at least a first input path coupled to the output path of the first block, at least a second input path to receive a local oscillator signal, and at least one output path coupled to the circuit output path, wherein the switching elements are each controlled as a function of a value of a bit of the digital input signal, a bit of index j of the digital input signal, where j is between 0 and m−1, is adapted to control the switching elements respectively associated with the unit cells of a group of $2^j$ unit cells.

2. The circuit of claim 1 wherein the digital input signal is a baseband signal, with a frequency of the local oscillator signal being equal to the transmission frequency.

3. The circuit of claim 1 wherein the power supply is arranged to regulate the activation voltage in response to a command to regulate a power of the analog signal to be transmitted.

4. The circuit of claim 1 wherein the digital input signal comprises a differential digital signal defined by a difference between a first digital component and a second digital component, and wherein the first block includes a first and a second transistor arranged in a manner such that:
   a gate of the first transistor is coupled to a control terminal of a first switching element controlled by the first digital component of the digital input signal, with another terminal of said first switching element being coupled to the power supply to receive the activation voltage,
   a gate of the second transistor is coupled to a control terminal of a second switching element controlled by the second digital component of the digital input signal, with another terminal of said second switching element being coupled to the power supply to receive the activation voltage,
   respective sources of the first and second transistors are coupled to a reference potential, and
   a drain of the first and second transistors are coupled respectively to a first and a second output path from the first block; and
   the second block includes a first pair of transistors, with a third and a fourth transistor and a second pair of transistors, with a fifth and a sixth transistor, said third, fourth, fifth, and sixth transistors being arranged such that:
      sources of the third and fourth transistors are coupled to the drain of the first transistor,
      sources of the fifth and sixth transistors are coupled to the drain of the second transistor,
      a gate of the fourth transistor is coupled to a gate of the fifth transistor,
      drains of the third and fifth transistors are respectively coupled to a first output path of the second block, and
      drains of the fourth and sixth transistors are respectively coupled to a second output path of the second block.

5. The circuit of claim 1 wherein the system-on-chip is adapted to transmit radio signals.

6. A system comprising:
   a circuit to output an analog signal at a given transmission frequency modulated by a digital signal coded in a number m of bits, where m is a given integer number, the circuit having at least one circuit output path to deliver the analog signal to be transmitted, a power supply to deliver an activation voltage, and a number $2^m-1$ of unit cells, each of the unit cells including:
      a first block having at least one input path coupled to the power supply to receive the activation voltage through a respective one of switching elements, and at least one output path, and
      a second block having at least a first input path coupled to the output path of the first block, at least a second input path to receive a local oscillator signal, and at least one output path coupled to the circuit output path, wherein the switching elements are each controlled as a function of a value of a bit of the digital input signal, a bit of index j of the digital input signal, where j is between 0 and m−1, is adapted to control the switching elements respectively associated with the unit cells of a group of $2^j$ unit cells;
   a power amplifier coupled to the circuit output path to increase a power of the analog signal; and
   an antenna coupled to the power amplifier to transmit the analog signal at the given transmission frequency modulated by the digital signal.

7. The system of claim 6 wherein the digital input signal is a baseband signal, with a frequency of the local oscillator signal being equal to the transmission frequency.

8. The system of claim 6 wherein the power supply is arranged to regulate the activation voltage in response to a command to regulate the power of the analog signal to be transmitted.

9. The system of claim 6 wherein the digital input signal comprises a differential digital signal defined by a difference between a first digital component and a second digital component, and wherein the first block includes a first and a second transistor arranged in a manner such that:
   a first terminal of the first transistor is coupled to a control terminal of a first switching element controlled by the first digital component of the digital input signal, with another terminal of said first switching element being coupled to the power supply to receive the activation voltage,
   a first terminal of the second transistor is coupled to a control terminal of a second switching element controlled by the second digital component of the digital input signal, with another terminal of said second switching element being coupled to the power supply to receive the activation voltage,
   respective second terminals of the first and second transistors are coupled to a reference potential, and a third terminal of the first and second transistors are coupled respectively to a first and a second output path from the first block; and the second block includes a first pair of transistors, with a third and a fourth transistor and a second pair of transistors, with a fifth and a sixth transistor, said third, fourth, fifth, and sixth transistors being arranged such that:

second terminals of the third and fourth transistors are coupled to the third terminal of the first transistor, second terminals of the fifth and sixth transistors are coupled to the third terminal of the second transistor, a first terminal of the fourth transistor is coupled to a first terminal of the fifth transistor, third terminals of the third and fifth transistors are respectively coupled to a first output path of the second block, and third terminals of the fourth and sixth transistors are respectively coupled to a second output path of the second block.

10. A method for transmitting an analog signal at a transmission frequency modulated by a digital input signal coded in a number m of bits, where m is a given integer number, the method comprising:

receiving the digital input signal;

receiving a local oscillator signal having the transmission frequency modulated by the digital input signal;

receiving an activation voltage from a power supply through a respective one of switching elements;

controlling the switching elements as a function of a value of a bit of the digital input signal; and transmitting the analog signal with the transmission frequency of the local oscillator signal.

11. The method of claim 10, further comprising regulating the activation voltage in response to a command to regulate a power of the analog signal to be transmitted.

12. The method of claim 11 wherein receiving the digital input signal comprises receiving a differential digital signal defined by a difference between a first digital component and a second digital component.

13. A circuit to transmit an analog signal at a transmission frequency modulated by a digital input signal coded in a number m of bits, where m is a given integer number, the circuit comprising:

means for receiving the digital input signal;

means for receiving a local oscillator signal having the transmission frequency modulated by the digital input signal;

means for receiving an activation voltage from a power supply through a respective one of switching elements;

means for controlling the switching elements as a function of a value of a bit of the digital input signal; and means for transmitting the analog signal with the transmission frequency of the local oscillator signal.

14. The circuit of claim 13, further comprising:

means for regulating the activation voltage in response to a command to regulate a power of the analog signal to be transmitted.

15. The circuit of claim 13 wherein means for receiving the digital input signal comprises means for receiving a differential digital signal defined by a difference between a first digital component and a second digital component.

* * * * *